(12) United States Patent
Aziz et al.

(10) Patent No.: US 6,392,250 B1
(45) Date of Patent: May 21, 2002

(54) ORGANIC LIGHT EMITTING DEVICES HAVING IMPROVED PERFORMANCE

(75) Inventors: Hany M. Aziz, Burlington; Zoran D. Popovic, Mississauga; Nan-Xing Hu, Oakville, all of (CA)

(73) Assignee: Xerox Corporation, Stamford, CT (US)

( * ) Notice: Subject to any disclaimer, the term of this patent is extended or adjusted under 35 U.S.C. 154(b) by 21 days.

(21) Appl. No.: 09/606,670

(22) Filed: Jun. 30, 2000

(51) Int. Cl.[7] .............................................. H01L 35/24
(52) U.S. Cl. ......................................... 257/40; 257/144
(58) Field of Search .......................... 427/66, 40, 144, 427/152, 431, 89; 428/690; 313/504, 503; 257/40, 144, 152, 431, 89

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,885,211 A | 12/1989 | Tang et al. | |
| 5,141,671 A | 8/1992 | Bryan et al. | |
| 5,150,006 A | 9/1992 | Van Slyke et al. | |
| 5,151,629 A | 9/1992 | Van Slyke | |
| 5,276,381 A | 1/1994 | Wakimoto et al. | |
| 5,405,709 A * | 4/1995 | Littman et al. | 428/690 |
| 5,429,884 A | 7/1995 | Namiki et al. | |
| 5,457,565 A | 10/1995 | Namiki et al. | |
| 5,516,577 A | 5/1996 | Matsuura et al. | |
| 5,608,287 A | 3/1997 | Hung et al. | |
| 5,739,635 A | 4/1998 | Wakimoto | |
| 5,846,666 A | 12/1998 | Hu et al. | |
| 5,891,587 A | 4/1999 | Hu et al. | |
| 5,925,472 A | 7/1999 | Hu et al. | |
| 5,925,980 A * | 7/1999 | So et al. | 313/504 |
| 5,932,363 A | 8/1999 | Hu et al. | |
| 6,020,078 A * | 2/2000 | Chen et al. | 428/690 |
| 6,048,573 A * | 4/2000 | Tang et al. | 427/66 |
| 6,069,442 A * | 5/2000 | Hung et al. | 313/504 |
| 6,130,001 A * | 10/2000 | Shi et al. | 428/690 |
| 6,140,763 A * | 10/2000 | Hung et al. | 313/503 |

OTHER PUBLICATIONS

Z.D. Popovic et al., "Improving the Efficiency and Stability of Organic Light Emitting Devices by Using Mixed Emitting Layers," Proceedings of the SPIE, vol. 3476, Organic Light–Emitting Materials And Devices II, San Diego, CA, Jul. 21–23, pp. 68–73 (1998).

W. Wen et al., "Single–Layer Organic Electroluminescent Devices By Vapor Deposition Polymerization," Appl. Phys. Lett. 71, 1302–1304 (1997).

S. Tokito et al., "High–Temperature Operation Of An Electroluminescent Device Fabricated Using A Novel Triphenylamine Derivative," Appl. Phys. Lett. 69(7), 878–879 (1996).

(List continued on next page.)

Primary Examiner—David Nelms
Assistant Examiner—Bau T Le
(74) Attorney, Agent, or Firm—Oliff & Berridge, PLC; Eugene O. Palazzo

(57) ABSTRACT

An organic light emitting device includes a mixed region composed of a mixture of a hole transport material, an electron transport material and at least one dopant material. The hole transport material and/or the electron transport material can optionally be an emitter. The materials of the mixed region can be selected to provide various emission colors from the organic light emitting device. The organic light emitting device also includes at least one of a hole transport material region and an electron transport material region on the mixed region. The hole transport material region, the electron transfer material region, and/or the mixed region can be formed with a plurality of layers.

48 Claims, 4 Drawing Sheets

OTHER PUBLICATIONS

S.A. Van Slyke et al., "Organic Electroluminescent Devices With Improved Stability," Appl. Phys. Lett, 69(15), pp. 2160–2162 (1996).

H. Aziz et al., "Degradation Mechanism Of Small Molecule--Based Organic Light Emitting Devices," Science 283, pp. 1900–1902 (1999).

C. Wu et al., "Efficient Organic Electroluminescent Devices Using Single–Layer Doped Polymer Thin Films With Bipolar Carrier Transport Abilities," IEEE Transactions on Electron Devices 44(8), pp. 1269–1281 (1997).

S. Naka et al., "Organic Electroluminescent Devices Using A Mixed Single Layer," Jpn.J.Appl.Phys. 33, Pt. 2 No. 12B, pp. L1772–L1774 (1994).

J. Kido et al., "Organic Electroluminescent Devices Based On Molecularly Doped Polymers," Appl. Phys. Lett. 61(7), pp. 761–763 (1992).

J. Shi et al., "Doped Organic Electroluminescent Devices With Improved Stability," Appl.Phys.Lett. 70(13), pp. 1665–1667 (1997).

Y. Hamada et al., "Influence Of The Emission Site On The Running Durability Of Organic Electroluminescent Devices," Jpn.J.Appl.Phys. 34, pp. L824–L826 (1995).

Z. Shen et al., "Three–Color, Tunable, Organic Light–Emitting Devices," Science 276, pp. 2009–2011 (1997).

J. Salbeck, "Electroluminescence With Organic Compounds," Ber. Bunsenges. Phys. Chem., 100, pp. 1667–1677 (1996).

J.R. Sheats et al., "Organic Electroluminescent Diodes," App. Phys. Lett. 51(12), pp. 913–915 (1987).

C.W. Tang et al., "Organic Electroluminescent Diodes," Appl. Phys. Lett. 51(12), pp. 913–915 (1987).

* cited by examiner

ORGANIC LIGHT EMITTING DEVICES HAVING IMPROVED PERFORMANCE

BACKGROUND OF THE INVENTION

1. Field of the Invention

This invention relates to optoelectronic devices and, more particularly, to organic light emitting devices. This invention also relates to methods of forming the organic light emitting devices.

2. Discussion of the Related Art

Tang and Van Slyke reported efficient electroluminescence from a bilayer organic device in 1987. C. W. Tang and S. A. Van Slyke, "Organic Electroluminescent Diodes," *Appl. Phys. Lett.* 51, pp. 913–915, 1987. Since that time, organic light emitting devices (OLEDs) have attracted great attention because of their potential toward the fabrication of large-area displays. See, J. R. Sheats et al, "Organic Electroluminescent Devices," *Science* 273, pp. 884–888, 1996; J. Salbeck, "Electroluminescence with Organic Compounds," *Ber. Bunsenges. Phys. Chem.* 100, pp. 1667–1677, 1996; and Z. Shen et al., "Three-Color, Tunable, Organic Light-Emitting Devices," *Science* 276, pp. 2009–2011, 1997.

To achieve efficient electroluminescence organic light emitting devices can include separate layers of a hole transport material (HTM) and an emitting electron transport material (ETM). The structure of such a conventional bilayer organic light emitting device 10 is shown in FIG. 1. The organic light emitting device 10 includes a substrate 12 composed of, for example, glass; an anode 14 on the substrate 12 and typically composed of a transparent conductor, for example, indium tin oxide (ITO); a hole transport material layer 16 on the anode 14; an electron transport material layer 18 on the hole transport material layer 16; and a cathode 20 on the electron transport layer 18 and typically composed of a low work function metal or metal alloy. During operation, an applied electric field causes positive charges (holes) and negative charges (electrons) to be respectively injected from the anode 14 and the cathode 20 to recombine and thereby produce light emission.

Also in organic light emitting devices, the separate hole transport and electron transport layers can be doped with organic dyes in order to enhance the efficiency, obtain a different emission color, or to improve the stability of the organic light emitting devices, reference Y. Hamada et al., "Influence of the Emission Site on the Running Durability of Organic Electroluminescent Devices," *Jpn. J. Appl. Phys.* 34, pp. L824–L826, 1995, and J. Shi et al., "Doped Organic Electroluminescent Devices with Improved Stability," *Appl.Phys. Lett.* 70, pp. 1665–1667, 1997.

There have also been attempts to obtain electroluminescence from organic light emitting devices containing mixed layers, that is for example, layers in which both the hole transport material and the emitting electron transport material are mixed together in one single layer, reference for example, J. Kido et al., "Organic Electroluminescent Devices Based On Molecularly Doped Polymers," *Appl. Phys. Lett.* 61, pp. 761–763, 1992; S. Naka et al., "Organic Electroluminescent Devices Using a Mixed Single Layer," *Jpn. J. Appl. Phys.* 33, pp. L1772–L1774, 1994; W. Wen et al., *Appl. Phys. Lett.* 71, 1302 (1997); and C. Wu et al., "Efficient Organic Electroluminescent Devices Using Single-Layer Doped Polymer Thin Films with Bipolar Carrier Transport Abilities," *IEEE Transactions on Electron Devices* 44, pp. 1269–1281, 1997. In many such structures, the electron transport material and the emitting material are the same. However, as described in the S. Naka et al. article, these single mixed layer organic light emitting devices are generally less efficient than multi-layer organic light emitting devices.

Moreover, the above-described references have not addressed the stability of these single mixed layer organic light emitting device structures. Research by the present inventors on organic light emitting devices structures including only a single mixed layer of a hole transport material (composed of NBP, a naphtyl-substituted benzidine derivative) and an emitting electron transport material (composed of $Alq_3$, tris (8-hydroxyquinoline) aluminum) have revealed that these known single mixed layer organic light emitting device structures are inherently unstable. The instability of these devices is believed to be caused by the direct contact between the electron transport material in the mixed layer and the hole injecting contact (comprised of indium tin oxide (ITO)), which results in the formation of the unstable cationic electronic transport material, as well as to the instability of the mixed layer/cathode interface, reference H. Aziz et al., "Degradation Mechanism of Small Molecule-Based Organic Light Emitting Devices," *Science* 283, pp. 1900–1902, 1999, the disclosure of which is totally incorporated herein by reference in its entirety.

There have also been attempts to obtain electroluminescence from organic light emitting devices by introducing hole transport materials and emitting electron transport materials as dopants in an inert host material, as reported in the above-described article by J. Kido et al. However, such known devices have been found to be generally less efficient than conventional devices including separate layers of hole transport material and emitting electron transport material.

A number of known organic light emitting devices have relatively short operational lifetimes before their luminance drops to some percentage of its initial value. Although known methods of providing interface layers, as described in S. A. Van Slyke et al., "Organic Electroluminescent Devices with Improved Stability," *Appl. Phys. Lett.* 69, pp. 2160–2162, 1996, and doping, as described, for example, in the above-described publication by Y. Hamada et al., have increased the operational lifetime of organic light emitting devices for room temperature operation, the effectiveness of the known organic light emitting devices deteriorates dramatically for high temperature device operation, as the existing methods used to extend the device lifetimes lose their effectiveness at higher temperatures. In general, device lifetime is reduced by a factor of about two for each 10° C. increment in the operational temperature. As a result, the operational lifetime of known organic light emitting devices at a normal display luminance level of about 100 $cd/m^2$ is limited to about a hundred hours or less at temperatures in the range of 60–80° C., reference the above-described article by J. R. Sheats et al. and also S. Tokito et al., "High-Temperature Operation of an Electroluminescent Device Fabricated Using a Novel Triphenlamine Derivative," *Appl. Phys. Lett.* 69, 878 (1996). These operational device lifetimes are unsatisfactory for use of the organic light emitting devices at these high temperatures, where an operational device lifetime in the order of several thousand hours is generally needed for various potential applications of organic light emitting devices.

SUMMARY OF THE INVENTION

U.S. patent application Ser. No. 09/357,551, filed on Jul. 20, 1999, and incorporated herein by reference in its entirety, describes organic light emitting devices (OLEDs) that comprise a mixed region including a mixture of a hole transport material and an electron transport material. At least one of a hole transport material region and an electron transport material region is formed on the mixed region. The organic light emitting devices have enhanced efficiencies and operational lifetimes and can provide operational stability at high temperature device operation conditions. Thus, these organic light emitting devices overcome the above-described disadvantages of known organic light emitting devices.

Other electroluminescent (EL) devices are described in U.S. Pat. Nos. 5,942,340; 5,952,115; 5,932,363; 5,925,472 and 5,891,587, which are each incorporated herein by reference in their entirety. U.S. Pat. No. 5,925,472 describes organic light emitting devices with blue luminescent materials comprised of metal chelates of oxadiazole compounds. These devices may provide a greenish blue color emission.

The organic light emitting devices described in incorporated U.S. patent application Ser. No. 09/357,551, can achieve operational device lifetimes of several thousands of hours at high temperatures. However, in these devices, the emission color is governed primarily by the choice of the hole transport material or the electron transport material in the mixed layer. Accordingly, various desirable emission colors may not be readily obtainable because of factors such as material mixing compatibility requirements, which can, in some embodiments of the devices, limit the number of hole and electron transport materials that can be used.

Furthermore, for organic light emitting devices, such as those described in incorporated U.S. patent application Ser. No. 09/357,551, for certain applications there is a need for increased electroluminescence efficiency. Embodiments of the present invention provide improved organic light emitting devices that also provide the enhanced efficiency and operational lifetimes that are needed in such applications.

In addition, embodiments of the organic light emitting devices according to this invention provide operational stability at high temperature device operation conditions.

Further, embodiments of the organic light emitting devices according to this invention also provide light emission in various emission colors.

Also, embodiments of the organic light emitting devices according to this invention provide increased electroluminescence efficiency.

Exemplary embodiments of the organic light emitting devices according to this invention comprise a mixed region comprising a mixture of a hole transport material, an electron transport material and a dopant material. The dopant is an emitter.

Exemplary embodiments of the organic light emitting devices according to this invention also comprise at least one of a hole transport material region and an electron transport region formed on the mixed region. At least one of the hole transport region and the electron transport region can optionally also be an emitter.

In embodiments, an anode contacts either the hole transport material region or a surface of the mixed region, and a cathode contacts either the electron transport material region or another surface of the mixed region.

The organic light emitting devices according to the invention can be utilized in various devices, such as displays, that typically are operated over a broad range of temperature conditions. The operational stability at high temperature conditions provided by the organic light emitting devices of this invention enables embodiments to be used at high temperature applications for extended periods of time. In addition, as stated above, the organic light emitting devices can provide various emission colors, as well as increased electroluminescence efficiency, as compared to known organic light emitting devices.

This invention also provides methods of forming the organic light emitting devices. One exemplary embodiment of the methods according to this invention comprises forming a mixed region comprising a mixture of a hole transport material, an electron transport material and a dopant material using a process, such as vacuum deposition.

In embodiments, a hole transport material region and/or an electron transport material region is formed on the mixed region. An anode is formed in contact with either the hole transport material region or with a surface of the mixed region. A cathode is formed in contact with either the electron transport material region or with another surface of the mixed region.

BRIEF DESCRIPTION OF THE DRAWINGS

Preferred embodiments of this invention will be described in detail, with reference to the following FIGS., in which.

DETAILED DESCRIPTION OF PREFERRED EMBODIMENTS

This invention provides organic light emitting devices (OLEDs) having improved electroluminescence (EL) efficiency and operational lifetimes as compared to known organic light emitting devices. The organic light emitting devices of this invention can be formed to emit various emission colors by doping the mixed region with various selected dopants. The dopants emit in a desired wavelength range and, thus, color range. For example, yellowish-green, amber or red emission can be obtained from an originally green-emitting device by selectively doping the mixed region. Or, for example, red or green emission can be obtained from an originally blue emitting device by selectively doping the mixed region.

The organic light emitting devices according to this invention can also be selected for high temperature device operation applications which require operating the devices for long periods of time, such as, for example, several thousands of hours at temperatures in the range of from about 60° C. to about 80° C.

Figure 1:
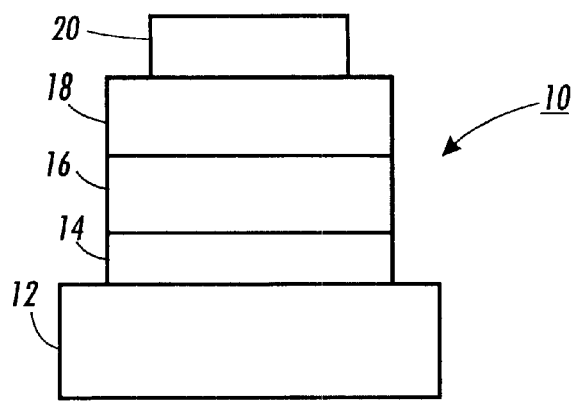
FIG. 1 illustrates a conventional organic light emitting device.
Figure 2:
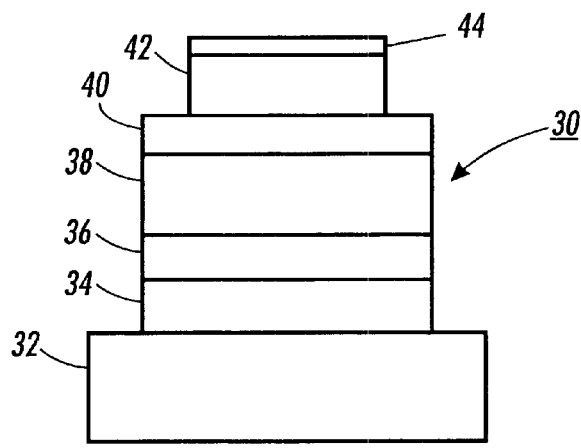
FIG. 2 illustrates an exemplary embodiment of an organic light emitting device according to this invention.

An exemplary embodiment of an organic light emitting device (OLED) 30 according to this invention is shown in FIG. 2. The organic light emitting device 30 comprises a substrate 32, an anode 34 on the substrate 32, a hole transport region 36 comprising a hole transport material (HTM) on the anode 34, a mixed region 38 comprising a mixture of a hole transport material and an electron transport material on the hole transport region 36, an electron transport region 40 comprising an electron transport material (ETM) on the mixed region 38, and a cathode 42 on the electron transport region 40. An optional protective layer 44 can be formed on the cathode 42. In the mixed region 38, one of the hole transport material and the electron transport material can be an emitter.

As described in detail below, the mixed region 38 also comprises at least one selected dopant that enables the organic light emitting device to emit selected emission colors. The dopants in the mixed region 38 are emitters.

At least one of the hole transport region 36 and the electron transport region 40 can optionally also be an emitter.

In embodiments of the organic light emitting devices 30 in which the dopant and at least one of the hole transport material or the electron transport material in the mixed region 38 is an emitter, the emission color from the mixed region 38 depends on the energy transfer from the hole transport material and/or the electron transport material to the dopant. For example, if this energy transfer is complete to the dopant, then the emission color from the organic light emitting device 30 will be the emission color of the dopant. However, if the energy transfer to the dopant is not complete, then the emission color from the organic light emitting device 30 will be determined by emission colors of the hole transport material and/or electron transport material and the dopant.

Although the hole transport region 36 and the electron transport region 40 are believed to achieve a more balanced charge injection process, and to reduce leakage of the carriers to the counter electrodes (Z. D. Popovic et al., *Proceedings of the SPIE*, Vol. 3476, "Organic Light-Emitting Materials and Devices II," San Diego, Calif., Jul. 21–23, 1998, pp. 68–73, incorporated herein by reference in its entirety), depending on the charge transport properties of the materials used, it may be desirable in some embodiments that the organic light emitting device 30 comprise only one of the hole transport region 36 and the electron transport region 40.

In embodiments of the organic light emitting devices according to this invention, only one of the hole transport region 36 or the electron transport region 40 can be formed on the mixed region 38. That is, in embodiments of the organic light emitting devices that comprise the hole transport region 36 between the anode 34 and the mixed region 38, but do not also comprise the electron transport region 40 between the mixed region 38 and the cathode 42, the mixed region 38 is in contact with the cathode 42. In embodiments of the organic light emitting devices that comprise the electron transport region 40 between the mixed region 38 and the cathode 42, but do not also comprise the hole transport region 36 between the anode 34 and the mixed region 38, the mixed region 38 is in contact with the anode 34.

Figure 3:
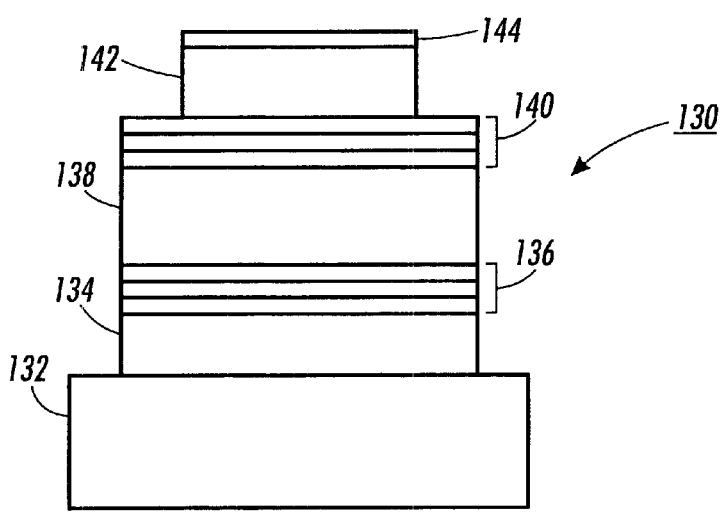
FIG. 3 illustrates an exemplary embodiment of an organic light emitting device according to this invention including multiple-layered hole transport and electron transport regions formed on the mixed region.

Also, in some embodiments, the organic light emitting devices according to this invention, at least one of the hole transport region 36 between the anode 34 and the mixed region 38, and the electron transport region 40 between the mixed region 38 and the cathode 42, comprises a plurality of separate layers. FIG. 3 illustrates an exemplary embodiment of such an organic light emitting device 130 according to this invention that comprises a multiple-layered hole transport region 136 and a multiple-layered electron transport region 140 on the mixed region 138. The number of individual layers of the hole transport region 136 and the electron transport region 140 can be selectively varied. Typically, in such embodiments, the number of layers of either of these materials is from two to about ten. Preferably, the number of layers is two or three.

The multiple-layered hole transport region 136 and electron transport region 140 can improve the operational performance of the organic light emitting device 130. Particularly, these structures can improve the injection of the carriers into the mixed region 138, reduce the operating voltage and improve device stability.

Moreover, in some embodiments of the organic light emitting device 130, one or more of the layers of one or both of the hole transport region 136 and the electron transport region 140 can comprise one or more dopants to primarily achieve changes in emission colors, or to improve device performance, such as to increase device efficiency and stability.

In addition, the multiple-layered hole transport region 136, or the multiple-layered electron transport region 140, can be formed in embodiments of the organic light emitting devices of this invention that comprise only one of a hole transport region, or an electron transport region, formed in contact with the mixed region 138. That is, in embodiments of this invention, one or the other of the multiple-layered hole transport region 136 and the multiple-layered electron transport region 140 can be omitted from the organic light emitting device 130. Furthermore, in embodiments of this invention where both the hole transport region 136 and the electron transport region 140 are present in the organic light emitting device 130, one of the hole transport region 136 and the electron transport region 140 can be a single-layer region, as shown in FIG. 2, and the other of the hole transport region 136 and the electron transport region 140 can be multiple-layer region, as shown in FIG. 3.

According to this invention, the hole transport material of the mixed region 38, 138 and the hole transport material of the hole transport region 36, 136 can be the same material, or can be a different material. In addition, the hole transport materials used in the different layers of the multiple-layer hole transport region 136 can be different or similar. Furthermore, the electron transport material of the mixed region 38, 138 and the electron transport material of the electron transport region 40, 140 can be the same material, or can be a different material. In addition, the electron transport materials used in the different layers of the multiple-layer electron transport region 140 can be different or similar.

According to this invention, embodiments of the organic light emitting devices 30, 130 can be fabricated to emit light having a broad range of wavelengths. By selection of suitable combinations and mixtures of the hole transport material, electron transport material and dopant material of the mixed region 38, 138, light emission at wavelengths ranging from about 400 nm to about 700 nm can be achieved from the organic light emitting devices 30, 130. Accordingly, the organic light emitting devices 30, 130 of this invention can emit light having a range of different colors associated with this light wavelength range by appropriate material selection. Thus, the organic light emitting devices 30, 130 of this invention can be used in various applications where certain specific light colors, such as red, green or blue are desired.

Various hole transport materials and electron transport materials are known in the art, as also is their combined selection to achieve desired color emissions. Furthermore, selection of such materials to provide a desired color emission can be readily conducted by one of ordinary skill in the art using routine experimentation.

According to this invention, embodiments of the organic light emitting devices can be operated under alternating current (AC) and/or direct current (DC) driving conditions. AC driving conditions are preferred to provide extended operational lifetimes, especially in high temperature device operation conditions. Preferred operating voltages are, for example, from about 3 volts to about 20 volts, and more preferably from about 5 volts to about 15 volts. Preferred driving currents are, for example, from about 1 to about 1000 mA/cm$^2$, and more preferably from about 10 mA/cm$^2$ to about 200 mA/cm$^2$. Of course driving voltages and currents outside of these ranges can be used.

The different portions of the organic light emitting devices 30, 130 according to this invention will now be described in greater detail.

The substrate 32, 132 can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Mixtures of these various materials can also be used. Other substrate materials can also be selected provided, for example, that the materials can effectively support the other layers, and do not interfere with the device functional performance. Preferably, in embodiments, the substrate 32, 132 is formed of a light transmission material.

The thickness of the substrate 32, 132 is not particularly limited except by the structural demands of the organic light emitting device and its intended use. Suitable thicknesses include, for example, from at least about 25 µm to at least about 1,000 µm.

The anode 34, 134 formed on the substrate 32, 132 can comprise suitable positive charge injecting electrodes such as indium tin oxide (ITO), tin oxide, gold and platinum. Other suitable materials for the anode include, but are not limited to, electrically conductive carbon, π-conjugated polymers such as polyaniline, polythiophene, polypyrrole, and the like having, for example, a work function equal to, or greater than, about 4 eV, and preferably from about 4 eV to about 6 eV.

The anode 34, 134 can be of any suitable form. A thin conductive layer can be coated onto a light transmissive substrate, for example, a transparent or substantially transparent glass plate or plastic film. Embodiments of the organic light emitting devices according to this invention can comprise a light transmissive anode formed from tin oxide or indium tin oxide (ITO) coated on a glass plate. Also, very thin light-transparent metallic anodes having a thickness, for example, of less than about 200 Å, and, preferably, from about 75 Å to about 150 Å can be used. These thin anodes can comprise metals such as gold, palladium and the like. In addition, transparent or semi-transparent thin layers of conductive carbon or conjugated polymers such as polyaniline, polythiophene, polypyrrole and the like, having a thickness of, for example from 50 Å to about 175 Å can be used as anodes. Additional suitable forms of the anode 34, 134 (and the cathode 42, 142) are disclosed in U.S. Pat. No. 4,885,211, incorporated herein by reference in its entirety.

The thickness of the anode 32, 132 can range from about 1 nm to about 5000 nm, with the preferred range depending on the optical constants of the anode material. One preferred range of thickness of the anode is from about 30 nm to about 300 nm. Of course, thicknesses outside of this range can also be used.

The hole transport material used to form the hole transport region 36, 136 and the mixed region 38, 138 can be any suitable known or later developed material. Suitable hole transport materials include, but are not limited to, conductive materials such as polyaniline and its acid-doped forms, polypyrrole, poly(phenylene vinylene), and known semiconductive organic materials; porphyrin derivatives such as 1,10,15,20-tetraphenyl-21H,23H-porphyrin copper (II) disclosed in U.S. Pat. No. 4,356,429, incorporated herein by reference in its entirety; copper phthalocyanine, copper tetramethyl phthalocyanine; zinc phthalocyanine; titanium oxide phthalocyanine; magnesium phthalocyanine; and the like. Mixtures of these and other suitable materials can also be used.

A preferred class of hole transporting materials are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, mixtures thereof and the like.

Another class of aromatic tertiary amines selected for the hole transport material is polynuclear aromatic amines. Examples of such polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like.

Another class of hole transporting materials is comprised of 4,4'-bis(9-carbazolyl)-1,1'-biphenyl compounds. Illustrative examples of 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like.

A preferred class of the hole transport materials is the indolo-carabazoles, such as those described in incorporated U.S. Pat. Nos. 5,942,340 and 5,952,115.

Another preferred class of hole transport materials are comprised of N,N,NN'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N;-di-1-naphthyl -N,N'-diphenyl-1,1'-biphenyl-4,4'-diamine, which is more preferred; N,N'-bis(3-methylphenyl) -N,N'-diphenyl-1,1'-biphenyl-4,4'-diamine; N,N'-bis(3-methoxyphenyl) -N,N'- diphenyl-1,1'-biphenyl-4,4'-diamine, and the like.

Preferred hole transport materials also include the naphtyl-substituted benzidine derivatives.

The hole transport material of the hole transport region 36, 136 can be prepared by forming one of the above-described materials into thin films by any suitable known or later developed method. Suitable methods for this purpose include, for example, vapor deposition and spin-coating techniques.

The hole transport region 36, 136 can comprise a hole transport material with a thickness ranging from about 5 nm to about 500 nm As described in incorporated U.S. patent appLn. Ser. No. 09/357,551, increasing the thickness of the mixed region increases the stability of the devices and also increase the operational voltage. A preferred thickness range of the hole transport region 36, 136 is from about 20 nm to about 80 nm. However, thicknesses outside of this range can also be used, as desired. In embodiments such as the organic light emitting device 136 comprising a multiple-layered hole transport region 136, the individual layers have a thickness of at least about 1 nm.

Illustrative examples of electron transport materials that can be utilized in the mixed region 38, 138 and the electron transport region 40, 140, include, but are not limited to, the metal chelates of 8-hydroxyquinoline as disclosed in U.S. Pat. Nos. 4,539,507; 5,151,629; 5,150,006 and 5,141,671, each incorporated herein by reference in its entirety. Illustrative examples include tris(8-hydroxyquinolinate) aluminum ($Alq_3$), which is a preferred electron transport material. Another preferred example is bis(8-hydroxyquinolato)-(4-phenylphenolato)aluminum (Balq). Other examples include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like.

Another preferred class of electron transport materials comprises stilbene derivatives, such as those disclosed in U.S. Pat. No. 5,516,577, which is incorporated herein by reference in it entirety. A preferred stilbene derivative is 4,4'-bis(2,2-diphenylvinyl)biphenyl.

Another class of preferred electron transport materials are the metal thioxinoid compounds, illustrated in U.S. Pat. No. 5,846,666, incorporated herein by reference in its entirety. These materials include metal thioxinoid compounds of bis(8-quinolinethiolato)zinc, bis(8-quinolinethiolato) cadmium, tris(8-quinolinethiolato)gallium, tris(8-quinolinethiolato)indium, bis(5-methylquinolinethiolato) zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc.

Another class of suitable electron transport materials for forming the electron transport region 40, 140 and the mixed region 38, 138 are the oxadiazole metal chelates disclosed in incorporated U.S. Pat. No. 5,925,472. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxypheny)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato] beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium, and the like.

Another class of suitable electron transport materials for forming the electron transport region 40, 140 and the mixed region 38, 138 are the triazines as described in U.S. Pat. No. 6,057,048 and U.S. patent appln. Ser. No. 09/489,144, filed on Jan. 21, 2000, each incorporated herein by reference in their entirety.

The electron transport region 40, 140 can comprise an electron transport material with a thickness ranging from about 5 mn to about 500 nm. Preferably, this thickness is from about 20 nm to about 80 nm. A thickness outside of these ranges can also be used. In embodiments such as the organic light emitting device 130 comprising a multiple-layered electron transport region 140, the individual layers have a thickness of at least about 1 nm.

Another class of materials that can be used in the mixed region 38,138 is the anthracene derivatives.

The mixed region 38, 138 contains at least one dopant material. Illustrative examples of the dopant materials that can be utilized in the mixed region 38, 138 include dyes such as coumarin, dicyanomethylene pyranes, polymethine, oxabenzanthrane, xanthene, pyrylium, carbostyl, perylene, and the like; dyes selected from the quinacridone derivatives of, for example, the formula:

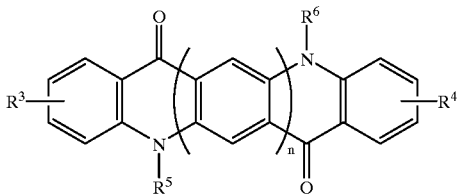

wherein $R^3$ and $R^4$ are independently hydrogen, alkyl, alkoxyl, aryl, fused aryl, such as naphthyl, or halogen; $R^5$ and $R^6$ are independently hydrogen, alkyl or aryl; and n equals 0, 1, 2 or 3. Illustrative examples of suitable quinacridone dyes include N,N'-dimethylquinacridone, N,N'-dimethyl-2-methyl quinacridone, N,N'-dimethyl-2,9-dimethylquinacridone, N,N'-dimethyl-2-chloroquinacridone, N,N'-dimethyl-2-fluoroquinacridone, and N,N'-dimethyl-1,2-benzoquinacridone. Another preferred class of fluorescent materials are the quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like, as described in U.S. Pat. Nos. 5,227,252, 5,276,381 and 5,593,788, which are each incorporated herein by reference in their entirety.

Another preferred class of dopant materials are the fused ring fluorescent dyes. Examples of the fused ring fluorescent dyes include perylene, rubrene, anthracene, coronene, phenanthrecene, pyrene and the like, as described in U.S. Pat. No. 3,172,862, which is incorporated herein by reference in its entirety. Fluorescent materials that can be used as a dopant include butadienes, such as 1,4-diphenylbutadiene and tetraphenylbutadiene, and stilbenes and the like, as described in U.S. Pat. Nos. 4,356,429 and 5,516,577, which are each incorporated herein by reference in their entirety. Other examples of dopant materials are those described in U.S. Pat. No. 5,601,903, which is incorporated herein by reference in its entirety.

Another preferred class of fluorescent dyes are those disclosed in U.S. Pat. No. 5,935,720, such as, for example, 4-(dicyanomethylene)-2-I-propyl-6-(1,1,7,7-tetramethyljulolidyl-9-enyl)-4H-pyran (DCJTB).

Another preferred class of dopant materials are the lanthanide metal chelate complexes, such as, for example, tris(acetylacetonato)(phenanthroline) terbium, tris(acetylacetonato)(phenanthroline) europium, and tris(thenoyl trisfluoroacetonato)(phenanthroline) europium, as disclosed in Kido et al., "White light emitting organic electroluminescent device using lanthanide complexes", *Jpn. J. Appl. Phys.*, Volume 35, pp. L394–L396 (1996), incorporated herein by reference in its entirety.

Another preferred class of dopant materials are the phosphorescent materials, such as, for example, organometallic compounds containing a heavy metal atom that leads to strong spin-orbit coupling, such as those disclosed in Baldo et.al., "Highly efficient organic phosphorescent emission from organic electroluminescent devices", *Letters to Nature*, 395, pp 151–154 (1998), incorporated herein by reference in its entirety. Preferred examples include 2,3,7,8,12,13,17,18-octaethyl-21H23H-phorpine platinum(II) (PtOEP) and fac tris(2-phenylpyridine)iridium Ir(ppy)$_3$).

According to this invention, the mixed region 38, 138 can comprise from about 5 wt % to about 95 wt % of the hole transport material, from about 95 wt % to about 5 wt % of the electron transport material, and from about 0.01 wt % to about 25 wt % of the dopant material. Preferably, the mixed region 38, 138 comprises from about 30 wt % to about 70 wt % of the hole transport material, from about 70 wt % to about 30 wt % of the electron transport material, and from about 0.05 wt % to about 10 wt % of the dopant material. Another preferred range in the mixed region 38, 138 is from about 40 wt % to about 60 wt % of the hole transport material, from about 60 wt % to about 40 wt % of the electron transport material and from about 0.1 wt % to about 2 wt % of the dopant material. Another preferred range for the dopant material in the mixed region 38, 138 is from about 0.2 wt % to about 1 wt %.

Another preferred range for the dopant material in the mixed region 38, 138 is from about 5 wt % to about 20 wt %.

The mixed region 38, 138 can be formed using mixtures of any of the suitable exemplary hole transport materials, electron transport materials and dopant materials described above.

The mixed region 38, 138 can be formed by any suitable method that enables the formation of selected mixtures of the hole transport materials, electron transport materials and dopant materials. For example, the mixed region 38, 138 can be formed by co-evaporating the hole transport material, electron transport material, and dopant material to form the mixed region 38, 138.

The thickness of the mixed region 38, 138 can vary from about 1 nm to about 1000 nm. The thickness of the mixed region 38, 138 is typically from about 10 nm to about 200 nm. Preferably, the thickness of the mixed region 38, 138 is from about 20 nm to about 100 nm. However, thicknesses outside of these ranges can also be used, as desired. As described in incorporated U.S. patent appln. Ser. No. 09/357, 551, reducing the thickness of the mixed region 38, 138 lowers the operational voltage and also the luminance (and EL efficiency) of the organic light emitting devices of this invention.

In embodiments of the organic light emitting devices according to this invention, the mixed region 38, 138 can comprise more than one layer. For example, the mixed region 38, 138 can selectively be formed to include two, three or even more separate layers. In such embodiments, the mixing ratios of the hole transport material and the electron transport material can be the same in each of the layers, or the mixing ratios can be varied in the layers. For example, the multiple layers can each comprise an equal weight percentage of the hole transport material and the electron transport material. In other embodiments, the mixed region can comprise different amounts of these materials.

The cathode 42, 142 can comprise any suitable metal, including high work function components, having a work function, for example, from about 4.0 eV to about 6.0 eV, or low work function components, such as metals with, for example, a work function of from about 2.5 eV to about 4.0 eV. The cathode can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals.

The Mg-Ag alloy cathodes described in U.S. Pat. No. 4,885,211, which is incorporated herein by reference in its entirety, are preferred cathode materials for forming the cathode 42, 142. Other preferred cathodes are described in U.S. Pat. No. 5,429,884, which is incorporated herein by reference in its entirety. These cathodes are formed from lithium alloys with other high work function metals such as aluminum and indium.

The cathode 42, 142 can also include an electron injection layer in contact with the electron transport region 40, 140 made of an insulative material such as an oxide material or an alkaline metal compound as described in U.S. Pat. Nos. 5,457,565, 5,608,287 and 5,739,635, which are each incorporated herein by reference in its entirety.

The thickness of the cathode 42, 142 can range from, for example, about 10 nm to about 500 nm. Of course, thicknesses outside of this range can also be used.

The optional protective layer 44, 144 can comprise any suitable material. For example, the material can be a metal, such as silver or gold. The material can also be a non-conductive material.

The following examples are provided to further illustrate various aspects of this invention, and are not intended to limit the scope of the invention.

EXAMPLES

A naphtyl-substituted benzidine derivative, N,N'-di-1-naphthyl-N,N'-diphenyl-1,1'-biphenyl-1,1'-biphenyl-4,4'-diamine (NPB), and tris (8-hydroxyquinoline) aluminum ($Alq_3$) are used as the hole transport material and the electron transport material, respectively, to form organic light emitting devices. N,N'-Dimethylquinacridone (DMQ), 5,6,11,12-tetraphenylnapthacene (Rubrene), and Nile-red dye (available from Aldrich Chemicals of Milwaukee, Wis.) are used as dopants. Organic light emitting devices having a structure such as the organic light emitting device 30 shown in FIG. 2 are formed and evaluated. The organic light emitting devices comprise a mixed region of about 50 wt % NPB and about 50 wt % $Alq_3$, having a thickness of about 80 nm. In some of the organic light emitting devices, the mixed region is doped with 0.2 wt % DMQ. In some other organic light emitting devices, the mixed region is doped with 0.8 wt % Rubrene. In still other organic light emitting devices, the mixed region is doped with 1.0 wt % Nile-red dye. The mixed region functions as both a charge transport region and an emitting region, due to the presence of the hole transport material, electron transport material, and emitting dopant.

The mixed region is formed between thin layers of NPB and $Alq_3$, respectively, having a thickness of about 80 nm and about 20 nm, respectively. The NPB layer and the $Alq_3$ layer act as hole-transport and electron-transport regions, respectively. The electron and hole transport regions are formed to increase the organic light emitting device efficiency and stability as described in incorporated U.S. patent appln. No. 09/357,551. See also, Z. D. Popovic et al., *Proceedings of the SPIE*, Vol. 3176, "Organic Light-Emitting Materials and Devices II," San Diego, Calif., Jul. 21–23, 1998, pp. 68–73, incorporated herein by reference in its entirety.

The hole transport region, the mixed region and the electron transport region are formed between an anode comprised of indium-tin-oxide (ITO) having a thickness of about 200 nm, and a cathode comprised of a Mg:Ag (10:1) alloy having a thickness of about 120 nm. The cathode is coated with a protective Ag layer having a thickness of about 80 nm.

The organic light emitting devices are fabricated using a vacuum evaporation process at a pressure of about $6\times10^{-6}$ torr. The mixed region is produced by the simultaneous evaporation of pure NPB, $Alq_3$, and dopant material from separate sources, with the single evaporation rates being varied from between about 0.02 to about 10 Å/s to obtain the desired mixing ratio of the mixed region.

Following formation of the hole transport region, the mixed region and the electron transport region, the metal cathode is deposited on the electron-transport region without breaking the vacuum.

For comparative purposes, organic light emitting devices having a structure that is similar to the structure of the organic light emitting devices formed according to this invention, but with an undoped mixed region, are formed from the same materials and fabricated during the same vacuum cycle on the same substrates, as the organic light emitting devices according to this invention. These comparative organic light emitting devices are also tested under the same conditions as the organic light emitting devices formed according to this invention.

Figure 4:
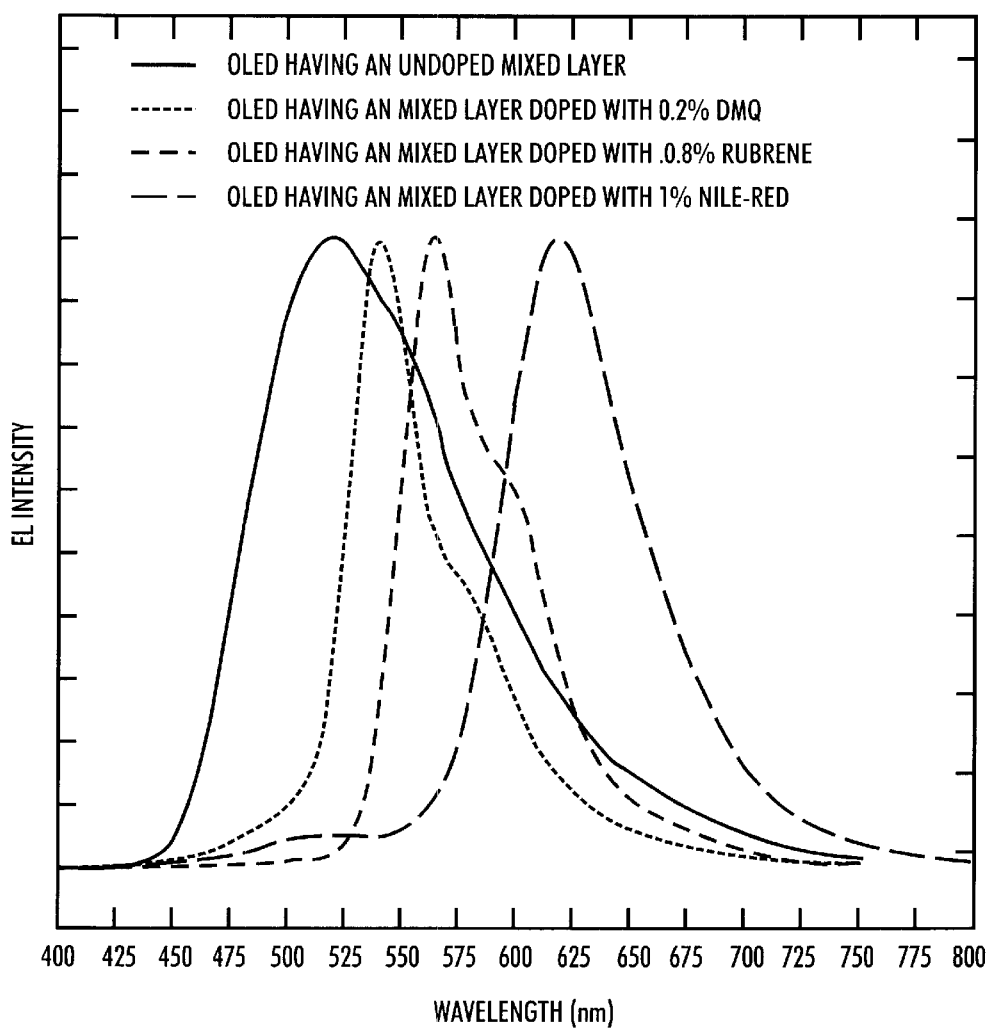
FIG. 4 illustrates the electroluminescence (EL) intensity versus emission wavelength of organic light emitting devices having mixed regions doped with 0.2 wt % DMQ, 0.8 wt % Rubrene and 1.0 wt % Nile-red dye according to this invention, and also of an oganic light emitting device with an undoped mixed region.

FIG. 4 shows the electroluminescence (EL) intensity versus emission wavelength characteristics of organic light emitting devices according to this invention having mixed regions doped with various dopant materials. The characteristics of a similar organic light emitting device with an undoped mixed region are also shown for comparison. As shown, doping a mixed region comprised of NPB and $Alq_3$, with DMQ, Rubrene and Nile-red dye changes the location of the peak of the electroluminescence spectrum from about 520 nm in the case of the undoped mixed region, which corresponds to green emission, to about 540 nm, about 560 nm, and about 617 nm, for a mixed region doped with DMQ, Rubrene and Nile-red, respectively, which corresponds to yellowish-green, amber and red emission, respectively.

Figure 5:
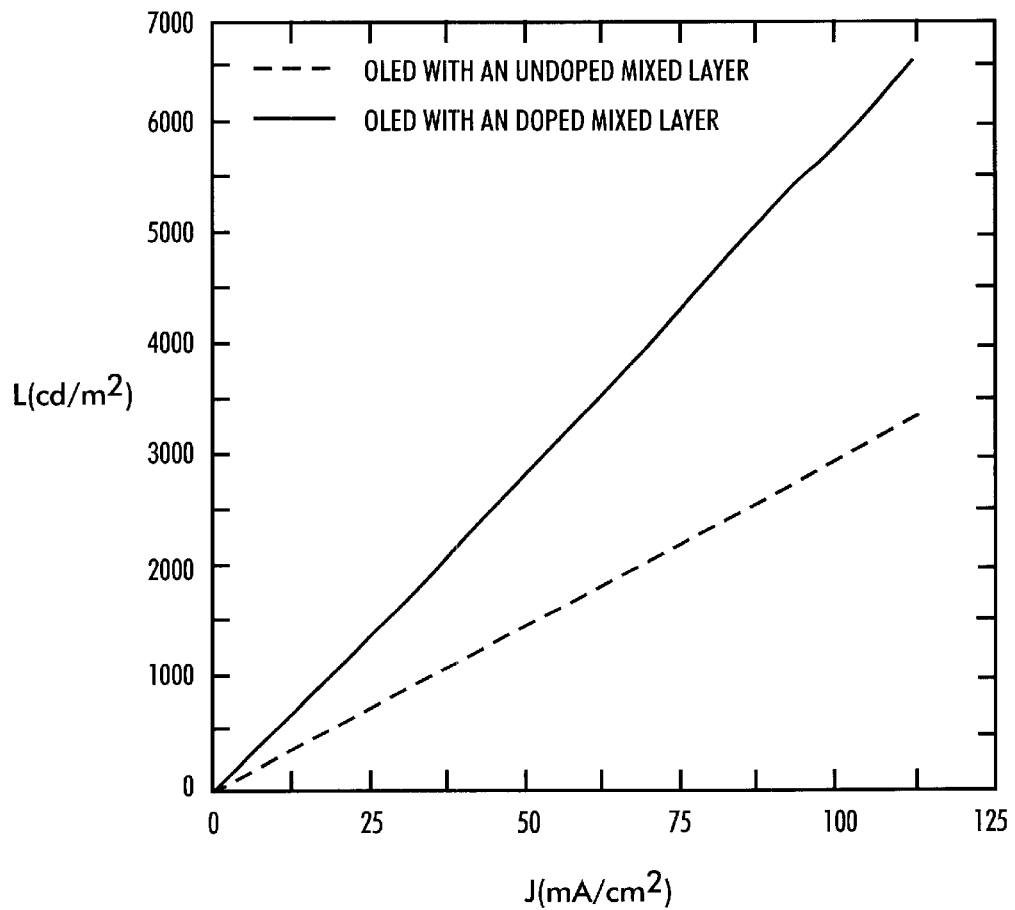
FIG. 5 illustrates the luminance (L) versus current density (J) characteristics of the organic light emitting devices having a mixed region doped with 0.8 wt % Rubrene according to this invention, and also of an organic light emitting device with an undoped mixed, region.

FIG. 5 shows the luminance, L, versus current density, J, characteristics of an organic light emitting device according to this invention with a mixed region doped with 0.8% wt % Rubrene. The luminance versus current density characteristics of a similar device with an undoped mixed region are also shown for comparison. Because the electroluminescence efficiency of a device is given by the slope of its luminance versus current density characteristics, a higher slope corresponds to a higher electroluminescence efficiency. As shown, the use of a dopant results in an increase in the electroluminescence efficiency of the device by about a factor of two, from about 2.8 cd/A (for the device with the undoped mixed region) to about 5.5 cd/A (for the device with the doped mixed region). In other similar devices in which the mixed layer is doped with 0.2 wt % of DMQ dopant material, the electroluminescence efficiency equals about 5.3 cd/A.

Stability tests are conducted to determine the operational lifetimes of organic light emitting devices. The operational lifetime is tested with the organic light emitting devices operated under constant current driving conditions in a dry air atmosphere. Organic light emitting devices having a structure such as the device 30 shown in FIG. 2, comprising a mixed region of about 50 wt % NPB, about 50 wt % $Alq_3$, and about 0.2 wt % DMQ, are operated using a 62.5 mA/cm² AC driving current at a temperature of about 22° C. Other identical devices are operated using the same driving conditions at a temperature of about 70° C. For comparison, other devices having a structure as described in incorporated U.S. patent appln. Ser. No. 09/357,551, which comprise an undoped mixed layer instead of the doped mixed layer, are operated using the same current driving conditions and at the same temperatures.

Figure 6:
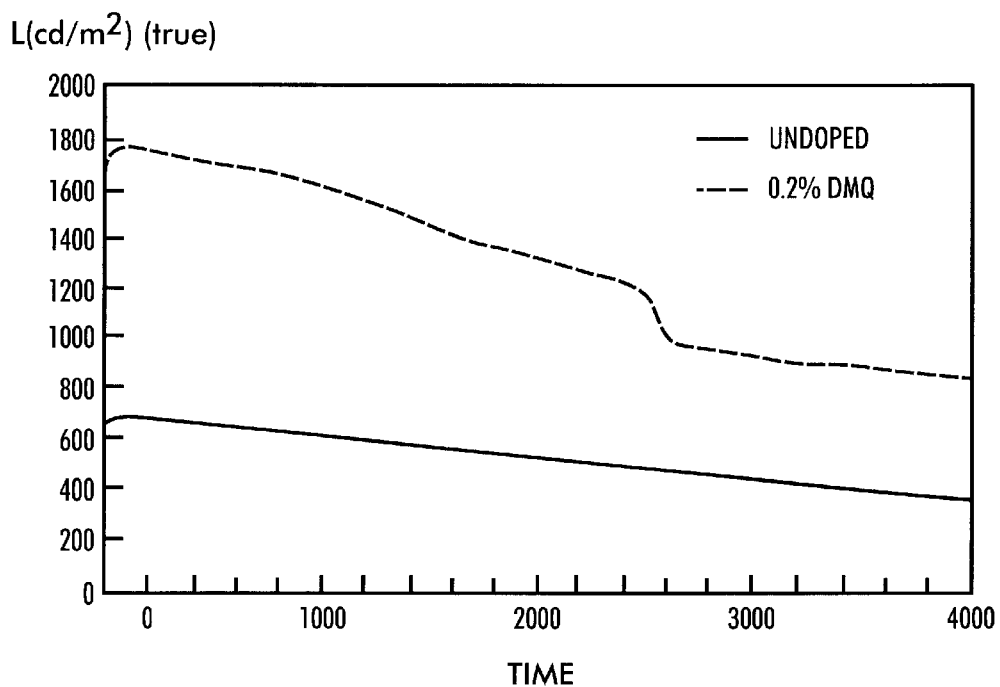
FIG. 6 illustrates the luminance (L) versus time characteristics of an organic light emitting device having a mixed region doped with 0.2 wt % DMQ according to this invention and also of an organic light emitting device with an undoped mixed region, with both devices operated at about 22° C. using AC driving conditions.
Figure 7:
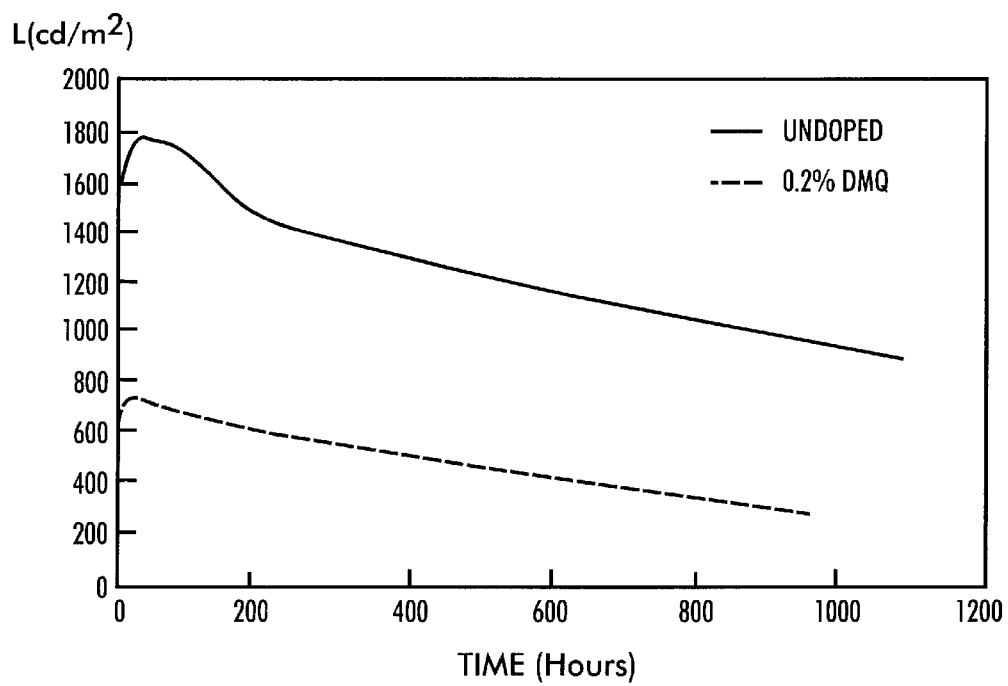
FIG. 7 illustrates the luminance (L) versus time characteristics of an organic light emitting device having a mixed region doped with 0.2 wt % DMQ according to this invention, and also of an organic light emitting device with an undoped mixed region, with both devices operated at about 70° C. using AC driving conditions.

FIGS. 6 and 7 show the results of the operational lifetime measurements, expressed in terms of luminance versus time, for both kinds of devices, at temperatures of about 22° C. and 70° C., respectively. The results show the enhanced stability performance of both device structures, i.e., of the devices with the doped mixed layer and the devices with the undoped mixed layer. The enhanced stability is attributed to the mixed region facilitating the direct recombination of holes on the hole transport molecule and the anionic species of the emitting electron transport material, and thus reducing the concentration and lifetime of the unstable cationic species of the emitting electron transport material. See, H. Aziz et al., "Degradation Mechanism of Small Molecule-Based Organic Light Emitting Devices," Science 283, 1900–1902 (1999), incorporated herein by reference in its entirety.

As can be seen from FIGS. 6 and 7, for a given temperature, organic light emitting devices with a doped mixed layer, and organic light emitting devices without a dopant in the mixed region, demonstrate similar half-lifetime (time elapsed before the luminance of an organic light emitting device drops to one-half of its initial value). In the given examples, the half-lifetime exceeds about 4000 hours and about 800 hours when the devices are operated at temperatures of about 22° C. and about 70° C., respectively. However, because of the higher efficiency of the devices with the doped mixed layer, which results in a significantly higher luminance at any particular driving current density, the devices with the doped mixed layer require lower driving current densities in order to achieve a certain display luminance, typically about 100 cd/m². Because of the lower driving current density requirement of the devices with the doped mixed layer, the half-lifetime of these devices is increased over that of the devices with the undoped mixed layer. For example, based on the measurements shown in FIGS. 6 and 7, a device with the undoped mixed layer operated at a typical display luminance of 100 cd/m² would have a half-lifetime exceeding about 5000 hours when operated at about 70° C. In comparison, a device with the doped mixed layer operated at the same conditions would have a half-lifetime exceeding about 15,000 hours.

As explained in incorporated U.S. patent appln. Ser. No. 09/357,551, known methods to improve device lifetime in organic light emitting devices lose their effectiveness at higher temperatures. In contrast, this invention achieves high operational stability at high temperatures, which enables the organic light emitting devices to be used for a number of various potential technological applications, in which this high-temperature stability is needed.

In addition, as described in incorporated U.S. patent appln. Ser. No. 09/357,551, the organic light emitting devices with a mixed region provide enhanced device lifetimes at room temperature conditions as compared to known devices that use, for example, a buffer layer at the hole injecting contact, or a doped hole transport layer.

The organic light emitting devices according to this invention can be used in various normal temperature condition technological applications. Furthermore, the high-temperature operational stability of the organic light emitting devices enables them to be used at high temperatures and in harsh conditions. For example, the devices can be used in various types of displays, such as, for example, in automobiles and other types of vehicles, computer monitors, televisions and other like electronic devices and systems. Moreover, the devices can be used in harsh conditions such as in industrial applications where high temperatures are often present. The devices provide stable performance at high temperatures of at least, for example, 50° C. or higher, or even 70° C. or higher, for extended lifetimes. Thus, the organic light emitting devices according to this invention can be used in applications in which conventional bi-layer devices would not be suitable. In addition, the organic light emitting devices according to this invention can provide various colors of light emission. In addition, these devices have increased electroluminescence efficiency due to the presence of the dopant material in the mixed region, as compared to devices without a dopant material in the mixed region, such as those described in incorporated U.S. patent appln. Ser. No.09/357,551.

While the invention has been described in conjunction with the specific embodiments described above, it is evident that many alternatives, modifications and variations are apparent to those skilled in the art. Accordingly, preferred embodiments of the invention as set forth above are intended to be illustrative and not limiting. Various changes can be made without departing from the spirit and scope of the invention.

What is claimed is:

1. An organic light emitting device, comprising:
   a mixed region having a first surface and a second surface, the mixed region comprising a mixture of a hole transport material, an electron transport material and at least one dopant, the dopant being an emitter, at least one of the hole transport material and the electron transport material optionally being an emitter;
   at least one of (i) a hole transport region on the first surface, and (ii) an electron transport region on the second surface;
   an anode in contact with the hole transport region on the first surface or with the first surface; and
   a cathode in contact with the electron transport region on the second surface or with the second surface.

2. The organic light emitting device of claim 1, comprising the hole transport region on the first surface and the electron transport region on the second surface.

3. The organic light emitting device of claim 2, wherein the hole transport region on the first surface and the electron transport region on the second surface each comprise a plurality of layers.

4. The organic light emitting device of claim 2, comprising:
   an anode comprising indium-tin-oxide and having a thickness of from about 30 nm to about 300 nm;
   a hole transport region comprising napthyl-substitiuted benzidine derivative (NPB) and having a thickness of from about 10 nm to about 100 nm;
   an electron transport region comprising tris (8-hydroxyquinoline) aluminum ($AlQ_3$) or bis(8-hydroxyquinolato)-(4-phenylphenolato)aluminum (Balq) and having a thickness of from about 10 nm to about 100 nm;
   a cathode comprising a Mg:Ag alloy or a Li:Al alloy and having a thickness of from about 50 nm to about 500 nm; and a mixed region between the hole transport region and the electron transport region, the mixed region comprising from about 30 wt % to about 70 wt % of NPB, from about 70 wt % to about 30 wt % of $AlQ_3$ or Balq, and from about 0.2 wt % to about 5 wt % of N,N'-dimethylquinacridone, rubrene or 4-(dicyanomethylene)-2-I-propyl-6-(1,1,7,7-tetratnethyljulolidyl-9-enyl)-4H-pyran, the mixed region having a thickness of from about 10 nm to about 100 nm.

5. The organic light emitting device of claim 1, comprising the hole transport region on the first surface, and no electron transport region on the second surface.

6. The organic light emitting device of claim 1, comprising the electron transport region on the second surface, and no hole transport region on the first surface.

7. The organic light emitting device of claim 1, wherein at least one of the hole transport region on the first surface, the electron transport region on the second surface and the mixed region comprises a plurality of layers.

8. The organic light emitting device of claim 1, wherein the hole transport region on the first surface comprises a plurality of layers, and the plurality of layers comprise different materials.

9. The organic light emitting device of claim 1, wherein the electron transport region on the second surface comprises a plurality of layers, and the plurality of layers comprise different materials.

10. The organic light emitting device of claim 1, comprising the hole transport region on the first surface, and wherein the hole transport material of the mixed region and the hole transport material of the hole transport region are the same material.

11. The organic light emitting device of claim 1, comprising the hole transport region on the first surface, and wherein the hole transport material of the mixed region and the hole transport material of the hole transport region are different materials.

12. The organic light emitting device of claim 1, comprising the electron transport region on the second surface, and wherein the electron transport material of the mixed region and the electron transport material of the electron transport region are the same material.

13. The organic light emitting device of claim 1, comprising the electron transport region on the second surface, and wherein the electron transport material of the mixed region and the electron transport material of the electron transport region are different materials.

14. The organic light emitting device of claim 1, wherein the mixed region comprises from about 5 wt % to about 95 wt % of the hole transport material, from about 95 wt % to about 5 wt % of the electron transport material, and from about 0.01 wt % to about 25 wt % of at least one dopant.

15. The organic light emitting device of claim 1, wherein the mixed region comprises from about 30 wt % to about 70 wt % of the hole transport material, from about 70 wt % to about 30 wt % of the electron transport material, and from about 0.1 wt % to about 5 wt % of at least one dopant.

16. The organic light emitting device of claim 1, wherein the mixed region comprises from about 30 wt % to about 70 wt % of the hole transport material, from about 70 wt % to about 30 wt % of the electron transport material, and from about 5 wt % to about 25 wt % of at least one dopant.

17. The organic light emitting device of claim 1, comprising:
the mixed region having a thickness of from about 1 nm to about 1000 nm;
a hole transport region having a thickness of from about 5 nm to about 500 nm on the first surface of the mixed region; and
an electron transport region having a thickness of from about 5 nm to about 500 nm on the second surface of the mixed region.

18. The organic light emitting device of claim 17, wherein the hole transport region has a thickness of from about 10 nm to about 80 nm on the first surface.

19. The organic light emitting device of claim 17, wherein the electron transport region has a thickness of from about 10 nm to about 80 nm on the second surface.

20. The organic light emitting device of claim 17, wherein the mixed region has a thickness of from about 10 nm to about 200 nm.

21. The organic light emitting device of claim 17, wherein the mixed region has a thickness of from about 20 nm to about 100 nm.

22. The organic light emitting device of claim 1, wherein:
the hole transport material that comprises at least one of the hole transport region and the mixed region is a tertiary aromatic amine or an indolocarbazole derivative; and
the electron transport material that comprises at least one of the electron transport region and the mixed region is selected from the group consisting of metal oxinoid compounds, a stilbene derivative, an oxadiazole metal chelate compound or a triazine compound.

23. The organic light emitting device of claim 22, wherein the hole transport material is a naphtyl-substituted benzidine derivative, and the electron transport material is one of tris(8-hydroxyquinoline)aluminum and bis(8-hydroxyquinolato)-(4-phenylphenolato)aluminum.

24. The organic light emitting device of claim 22, wherein the hole transport material is an indolocarbazole derivative, and the electron transport material is one of tris(8-hydroxyquinoline)aluminum and bis(8-hydroxyquinolato)-(4-phenylphenolato)aluminum.

25. The organic light emitting device of claim 22, wherein:
the hole transport material of the mixed region comprises a naphtyl-substituted benzidine derivative;
the hole transport material of the hole transport region comprises an indolocarbazole derivative; and
the electron transport material of the mixed region comprises tris (8-hydroxyquinoline)aluminum or bis(8-hydroxyquinoline)-(4-phenylphenolato)aluminum.

26. The organic light emitting device of claim 1, wherein the mixed region comprises an anthracene derivative.

27. A display comprising at least one organic light emitting device according to claim 1.

28. The organic light emitting device of claim 1, wherein the mixed region consists essentially of the hole transport material, the electron transport material, and from about 0.01 wt % to about 25 wt % of at least one dopant based on the weight of the hole transport material and the electron transport material.

29. The organic light emitting device of claim 1, wherein the mixed region consists essentially of the hole transport material, the electron transport material, and from about 0.1 wt % to about 5 wt % of at least one dopant based on the weight of the hole transport material and the electron transport material.

30. The organic light emitting device of claim 1, wherein the mixed region consists essentially of the hole transport material, the electron transport material, and from about 5 wt % to about 25 wt % of at least one dopant based on the weight of the hole transport material and the electron transport material.

31. The organic light emitting device of claim 1, wherein at least one dopant is a fluorescent material.

32. The organic light emitting device of claim 31, wherein at least one dopant is a fluorescent material selected from the group consisting of coumarin, dicyanomethylene pyranes, polymethine, oxabenzanthrane, xanthene, pyrylium, carbostyl, perylene, quinacridone, rubrene, anthracene, coronene, phenanthrecene, pyrene, butadiene, stilbene, and derivatives thereof.

33. The organic light emitting device of claim 32, wherein the mixed region comprises from about 0.1 wt % to about 5 wt % of the at least one dopant, and at least one dopant is selected from the group consisting of rubrene, N,N'-dimethylquinacridone, and perylene.

34. The organic light emitting device of claim 32, wherein the mixed region comprises from about 0.1 wt % to about 5 wt % of at least one dopant, and at least one dopant is coumarin or a derivative thereof.

35. The organic light emitting device of claim 31, wherein at least one dopant is a fluorescent material selected from the group consisting of lanthanide and rare-earth metal chelate complexes.

36. The organic light emitting device of claim 35, wherein the mixed region comprises from about 0.01 wt % to about 25 wt % of at least one dopant, and at least one dopant is selected from the group consisting of tris(acety lacetonato) (phenanthroline)terbium, tris(acetyl acetonato) (phenanthroline) europium, and tris(thenoyl trisfluoroacetonato)(phenanthroline)europium.

37. The organic light emitting device of claim 31, wherein the mixed region comprises from about 0.1 wt % to about 5 wt % of at least one dopant, and at least one dopant is 4-(dicyanomethylene)-2-I-propyl-6-(1,1,7,7-tetramethyljulolidyl-9-enyl)-4H-pyran.

38. The organic light emitting device of claim 1, wherein at least one dopant is a phosphorescent material.

39. The organic light emitting device of claim 38, wherein the mixed region comprises from about 0.01 wt % to about 25 wt % of at least one dopant, and at least one dopant is selected from the group consisting of 2,3,7,8,12,13,17,18-octaethyl-21H23H-phorpine platinum(II) and fac tris(2-phenylpyridine)iridium.

40. The organic light emitting device of claim 1, wherein green, amber or red emission is achieved by using N,N'-dimethylquinacridone, rubrene or 4-(dicyanomethylene)-2-I-propyl-6-(1,1,7,7-tetramethyljulolidyl-9-enyl)-4H-pyran in the mixed region.

41. The organic light emitting device of claim 1, wherein the organic light emitting device is operable at a temperature of at least about 50° C. for at least about 100 hours.

42. The organic light emitting device of claim 41, wherein the mixed region comprises from about 5 wt % to about 95 wt % of the hole transport material, from about 95 wt % to about 5 wt % of the electron transport material, and from about 0.01 wt % to about 25 wt % of the at least one dopant.

43. A method of making an organic light emitting device, comprising:
   forming a mixed region having a first surface and a second surface, the mixed region comprising a mixture of a hole transport material, an electron transport material and at least one dopant, the dopant being an emitter, at least one of the hole transport material and the electron transport material optionally being an emitter;
   forming at least one of (i) a hole transport region on the first surface, and (ii) an electron transport region on the second surface;
   forming an anode in contact with the hole transport region on the first surface or with the first surface; and
   forming a cathode in contact with the electron transport region on the second surface or with the second surface.

44. An organic light emitting device, comprising:
   a mixed region having a first surface and a second surface, the mixed region comprising a mixture of a hole transport material, an electron transport material and at least one dopant that is an emitter;
   an anode;
   a hole transport region between the first surface of the mixed region and the anode;
   a cathode; and
   an electron transport region between the second surface of the mixed region and the cathode.

45. An organic light emitting device, comprising:
   a mixed region having a first surface and a second surface, the mixed region comprising a mixture of a hole transport material, an electron transport material and at least one dopant that is an emitter, and the mixed region having a mixing ratio of the hole transport material, electron transport material and at least one dopant that is not varied in the mixed region;
   an anode;
   a cathode; and
   at least one of (i) a hole transport region between the first surface of the mixed region and the anode, and (ii) an electron transport region between the second surface of the mixed region and the cathode.

46. The organic light emitting device of claim 45, comprising the hole transport region between the first surface of the mixed region and the anode.

47. The organic light emitting device of claim 45, comprising the electron transport region between the second surface of the mixed region and the cathode.

48. The organic light emitting device of claim 45, comprising the hole transport region between the first surface of the mixed region and the anode, and the electron transport region between the second surface of the mixed region and the cathode.

* * * * *